US009798654B2

(12) United States Patent
Emma et al.

(10) Patent No.: US 9,798,654 B2
(45) Date of Patent: Oct. 24, 2017

(54) RETENTION MANAGEMENT FOR PHASE CHANGE MEMORY LIFETIME IMPROVEMENT THROUGH APPLICATION AND HARDWARE PROFILE MATCHING

(75) Inventors: Philip G. Emma, Danbury, CT (US); Eren Kursun, Ossining, NY (US)

(73) Assignee: International Business Machines Corporation, Armonk, NY (US)

(*) Notice: Subject to any disclaimer, the term of this patent is extended or adjusted under 35 U.S.C. 154(b) by 1257 days.

(21) Appl. No.: 13/233,714

(22) Filed: Sep. 15, 2011

(65) Prior Publication Data

US 2013/0073785 A1  Mar. 21, 2013

(51) Int. Cl.
*G06F 12/02* (2006.01)
*G11C 13/00* (2006.01)
*G11C 7/04* (2006.01)

(52) U.S. Cl.
CPC ...... *G06F 12/0223* (2013.01); *G06F 12/0238* (2013.01); *G11C 13/0004* (2013.01); *G11C 13/0035* (2013.01); *G11C 13/0069* (2013.01); *G06F 12/0246* (2013.01); *G06F 2212/2024* (2013.01); *G11C 7/04* (2013.01)

(58) Field of Classification Search
CPC .................................................. G06F 12/0246
USPC .... 711/103, 102, 165, E12.008; 365/185.25, 365/185.03, 222
See application file for complete search history.

(56) References Cited

U.S. PATENT DOCUMENTS

| RE37,259 E | 7/2001 | Ovshinsky .................... 365/163 |
|---|---|---|
| 7,460,394 B2 * | 12/2008 | Happ et al. ................... 365/163 |
| 7,623,401 B2 * | 11/2009 | Philipp et al. ................ 365/222 |
| 7,870,331 B2 | 1/2011 | Sutardja et al. .............. 711/108 |
| 8,120,969 B1 * | 2/2012 | Montierth et al. ........ 365/185.25 |
| 8,315,092 B2 * | 11/2012 | Strasser et al. .......... 365/185.03 |
| 8,437,189 B1 * | 5/2013 | Montierth ............. G11C 16/10 365/185.09 |
| 2005/0198002 A1 * | 9/2005 | Ito ......................... G06F 11/167 |
| 2008/0256325 A1 * | 10/2008 | Josiek ..................... G06F 12/04 711/202 |
| 2010/0050053 A1 * | 2/2010 | Wilson ................ G06F 11/1068 714/773 |
| 2010/0058127 A1 | 3/2010 | Terao et al. .................... 714/718 |
| 2010/0253555 A1 | 10/2010 | Weingarten et al. ........... 341/51 |

(Continued)

OTHER PUBLICATIONS

Burr et al., "Phase change memory technology," Journal of Vacuum Science & Technology B, vol. 28, issue 2, Mar. 19, 2010.

(Continued)

*Primary Examiner* — Ryan Bertram
*Assistant Examiner* — Trang Ta
(74) *Attorney, Agent, or Firm* — Ido Tuchman; Jennifer R. Davis

(57) ABSTRACT

Methods and systems for managing memory and stress to memory systems. A method for managing memory includes receiving from a software application memory retention requirements for application data. The memory retention requirements include storage duration length and/or criticality of data retention. The method also includes storing the application data in one of a plurality of memory regions in non-volatile memory based on the memory retention requirements and memory retention characteristics of the memory regions. Each memory region may have different memory retention characteristics.

21 Claims, 12 Drawing Sheets

(56) References Cited

U.S. PATENT DOCUMENTS

| | | | |
|---|---|---|---|
| 2011/0026303 A1 | 2/2011 | Choi et al. | 365/148 |
| 2011/0063903 A1* | 3/2011 | Kang | G11C 8/08 365/163 |
| 2011/0219203 A1* | 9/2011 | Nurminen | G11C 7/04 711/165 |
| 2012/0203951 A1* | 8/2012 | Wood et al. | 711/102 |
| 2012/0324191 A1* | 12/2012 | Strange et al. | 711/165 |
| 2012/0331207 A1* | 12/2012 | Lassa | G06F 1/3278 711/103 |

OTHER PUBLICATIONS

Freitas et al., "Storage-class memory: the next storage system technology," IBM Journal of Research & Development, vol. 52, No. 4/5 Jul./Sep. 2008.

Qureshi et al., "Enhancing Lifetime and Security of PCM-Based Main Memory with Start-Gap Wear Leveling," Microarchitecture, 2009. MICRO-42. 42nd Annual IEEE/ACM International Symposium on.

Cho et al., "Flip-N-Write: A Simple Deterministic Technique to Improve PRAM Write Performance, Energy and Endurance" Microarchitecture, 2009. MICRO-42. 42nd Annual IEEE/ACM International Symposium on Publication Year: 2009 , pp. 347-357.

Joshi et al., "Mercury: A Fast and Energy-Efficient Multi-level Cell based Phase Change Memory System," High Performance Computer Architecture (HPCA), 2011 IEEE 17th International Symposium.

Xu et al., "Data Manipulation Techniques to Reduce Phase Change memory Write Energy," ISLPED '09, Aug. 19-21, 2009, Copyright 2009 ACM p. 237-242.

* cited by examiner

US 9,798,654 B2

RETENTION MANAGEMENT FOR PHASE CHANGE MEMORY LIFETIME IMPROVEMENT THROUGH APPLICATION AND HARDWARE PROFILE MATCHING

BACKGROUND

The present invention is directed towards memory controllers, and more particularly to the use of sensors to control and adapt to memory with changing retention characteristics.

Phase change memory is an emerging memory technology that has shown promising characteristics. Common phase change memory materials may include chalcogenides. Phase change memory materials include materials that have multiple solid states. Each of these solid states may have different properties. For example, a material may achieve an ordered solid state or a relatively disordered solid state depending on the process used to heat and cool the material. The different properties of each state may be measured. For example, the resistivity of each state may used to measure the value of a memory cell. The state with a lower resistivity may represent a stored value of 1 and a state with a higher resistivity may represent a stored value of 0 and vice versa. The solid states may, however, change over the lifetime of a memory cell due to stress.

BRIEF SUMMARY

An example embodiment of the present invention is a method of managing memory. The method includes receiving from a software application memory retention requirements for application data. The memory retention requirements include a storage duration length and/or a criticality of data retention. The method also includes matching the storage duration length and the criticality of data retention with memory regions. The application data is then stored in one or more of the memory regions based on the memory retention requirements. The memory regions are in non-volatile memory and have different memory retention characteristics. One embodiment of the invention relies on application and hardware profile matching to maximize the efficiency of memory region usage and quality of available memory. In many wear-level techniques the active memory regions are rotated in an attempt to wear out every region evenly. However in such schemes high-quality/high-retention regions generally disappear well before the chip is worn out. In order to maximize the availability of the chip one proposed technique maximizes the availability of the chip to all kinds of applications.

Another example embodiment of the present invention is a system for managing memory. The system includes a memory controller configured to receive, from a software application, memory retention requirements for application data. The memory controller is configured to store the application data in one of a plurality of memory regions in non-volatile memory based on the memory retention requirements and memory retention characteristics of the memory regions. The memory retention requirements include a storage duration length and/or a criticality of data retention.

Another example embodiment of the present invention is a method of managing stress to memory regions. The method includes receiving new data from a software application. The new data is received to be stored in a target memory region. The method includes modulating the new data to resemble former data. The former data is stored in the target memory region. Modulating the new data is configured to minimize in writing the modulated data to the target memory region the bits in the target memory region to be altered.

Yet another example embodiment of the invention is a system for managing stress to memory regions. The system includes a memory controller configured to receive new data from a software application. The new data is received to be stored in a target memory region. The memory controller is further configured to modulate by a computer processor the new data to resemble former data stored on the target memory region. Modulating the new data minimizes a number of bits to be altered in writing the modulated data to the target memory region. This particular stage can be used when the memory regions have higher wear out complications.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DETAILED DESCRIPTION

The present invention is described with reference to embodiments of the invention. Throughout the description of the invention reference is made to FIGS. 1-12. As discussed in detail below, embodiments of the present invention include a method and system for managing memory as well as a method and system for managing stress to a memory region. Some embodiments of the systems and methods below may include phase change memory in the memory regions, but other embodiment may be directed to other kinds of memory.

Figure 1:
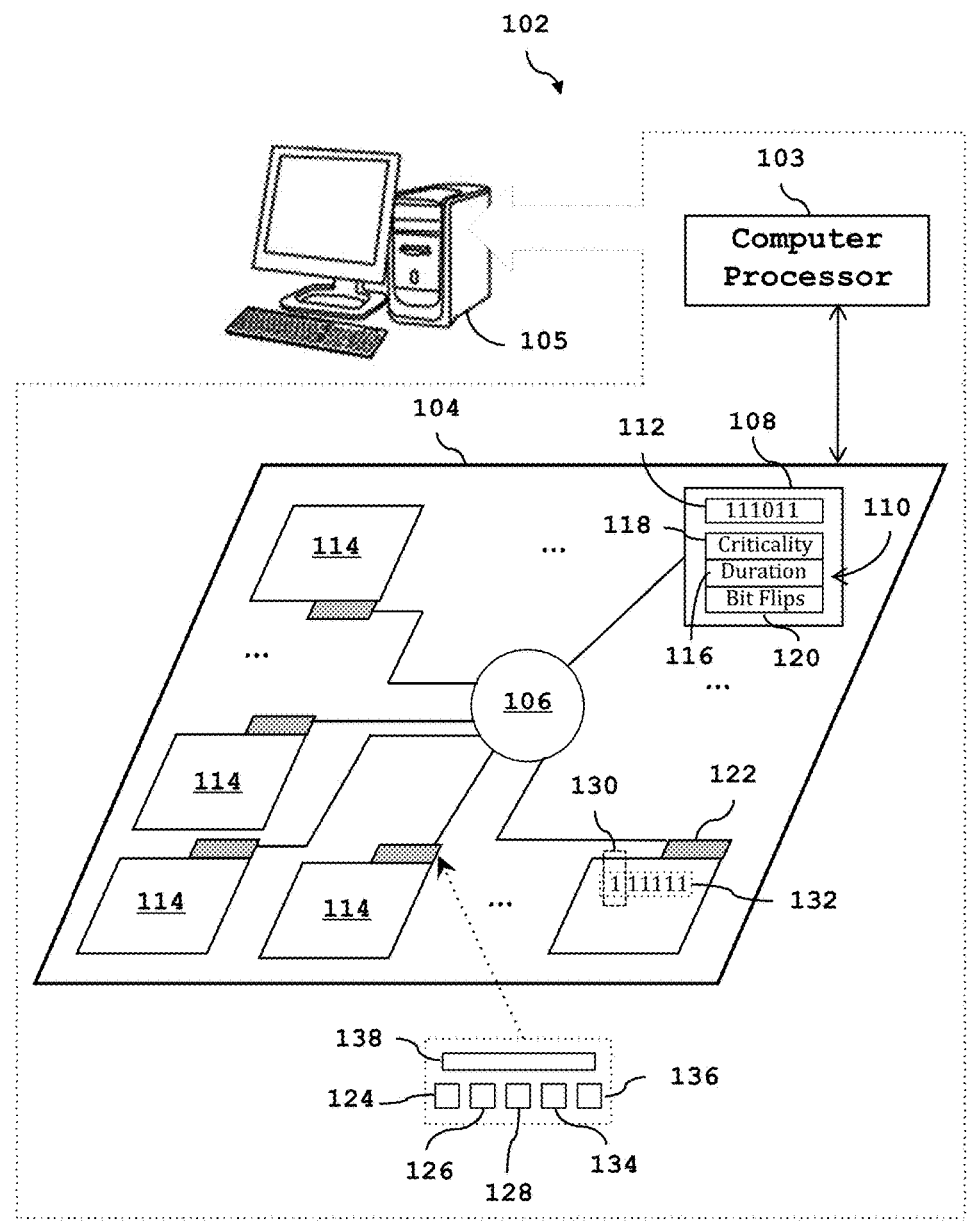
FIG. 1 is a schematic view showing an example embodiment of a system for managing memory in accordance with the present invention.

FIG. 1 is a schematic view showing an example embodiment of a system 102 for managing memory 104 in accordance with the present invention. In one embodiment, the system 102 includes a computer processor 103 and memory 104 integrated into a computer system 105. The system 102 may include a memory controller 106 configured to receive from a software application 108 memory retention requirements 110 for application data 112. In one embodiment, the system 102 is configured to store the application data 112 based on the memory retention requirements 110 in one of a plurality of memory regions 114. For example, for the cases where the memory retention requirements 110 indicate that the application data 112 needs to be retained for a longer time, the memory controller 106 may store the application data 112 in a memory region 114 with best retention (minimum failure expectations). For other cases where long-term retention is not needed and/or the application data 112 is not of critical nature the translation can be done to a physical address that might potentially have retention problems.

Figure 12:
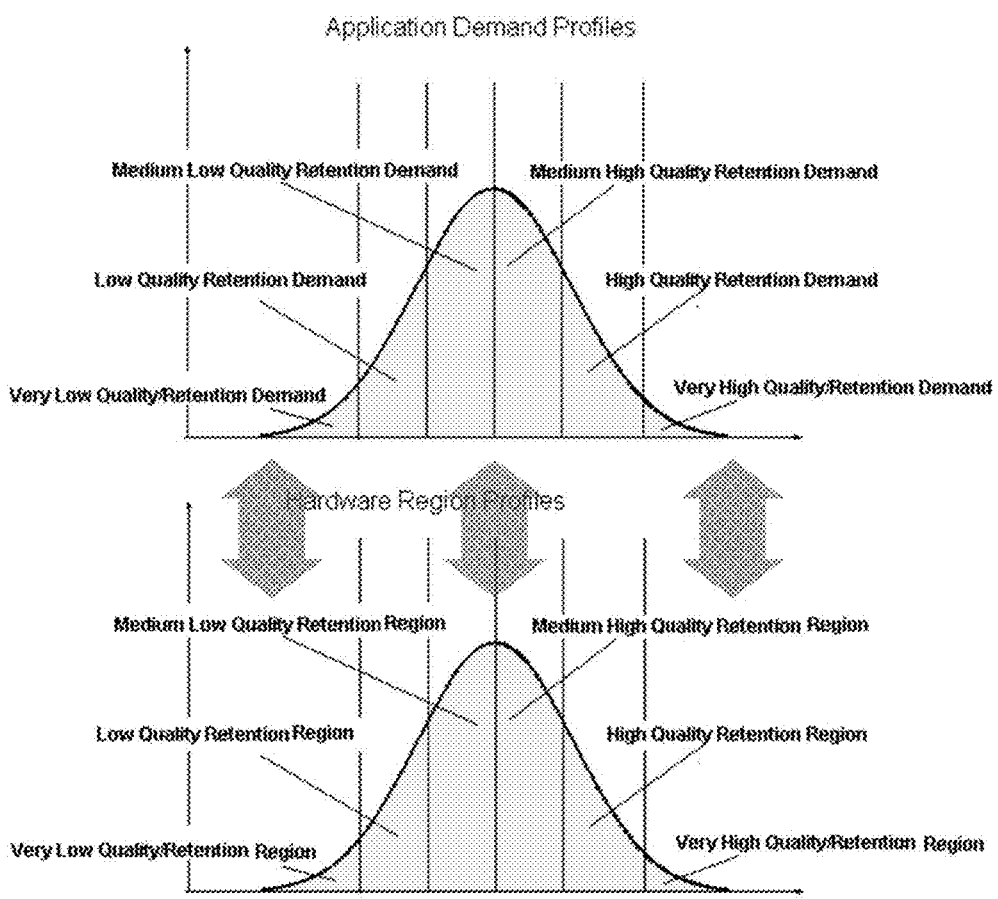
FIG. 12 shows an example variation in application memory quality/retention demand and hardware characteristics.

FIG. 12 shows an example variation in application memory quality/retention demand and hardware characteristics. One embodiment of the invention matches the quality of the demand with the hardware characteristics—this guarantees that none of the very high quality regions are wastefully used by low quality demanding application just to balance out the hardware characteristics. By eliminating the over usage and under usage the efficiency of the assignment is maximized. The technique may include a configurable modulation stage that can be leveraged when the wear out becomes more prominent and the assignments become increasingly suboptimal.

Turning back to FIG. 1, the memory regions 114 may be in non-volatile memory 104, and the memory regions 114 may have different memory retention characteristics. Non-volatile memory 104 is memory that retains stored information even when not powered and includes phase change memory. Memory retention requirements can include a storage duration length 116 and/or a criticality 118 of data retention. The storage duration length 116 may include a time or a descriptor such as short, medium, or long. The criticality 118 of data retention may include descriptors such as high, medium, or low. In addition, other descriptions showing varying levels of division may be used as storage duration lengths and criticality. In one embodiment, the memory retention requirements include an expected number of bit flips 120 or, similarly, an expected number of high current changes.

As used herein, "retention characteristic" is defined as a memory fatigue in particular memory technologies, known to those skilled in the art, causing memory cells in a memory region to lose data due to their limited write endurance. In one embodiment, the memory controller 106 is further configured to determine the memory retention characteristics of the memory region 114 from the plurality of memory regions 114 with a retention sensor 122. The memory retention characteristics corresponding to each memory region 114 may include storage reliability, average temperature, peak temperature, usage patterns information such as an electrical current history or the number of times data is written to the memory region, and information showing comparison to other memory regions used as a reference.

The memory controller 106 may be configured to compare the memory retention requirements 110 for application data 112 to the memory retention characteristics of the memory region 114 from the plurality of memory regions 114. In one embodiment, the memory controller 106 may compare the requirements by performing mathematical evaluations. For example, the memory controller 106 may obtain an expected retention time (memory retention characteristic) of a memory region 114 and subtract from the expected retention time the storage duration length 116 (memory retention requirement 110) provided by the software application 108. A positive number as a result may indicate that the memory region 114 is suitable to store the application data 112. For comparison of non-mathematical values, logic operations may be performed to demonstrate matching or mismatching values.

The memory controller 106 may further be configured to determine a memory region 114 from the plurality of memory regions 114. The memory controller 106 may be configured to store the application data 112 such that memory retention loss to one or more of the plurality of memory regions 114 is minimized. For example, the memory controller 106 may not select a memory region 114 that has been used heavily and select a memory region 114 that has been used only a little. In another embodiment, the memory controller 106 may not select a memory region 114 that has had little use and select a memory region that has had much use in order to preserve the memory retention characteristics of the lesser used memory region 114.

In one embodiment, the memory controller 106 is configured to determine a memory region 114 of the plurality of memory regions 114 to store the application data 112. The memory controller 106 may determine the memory region 112 such that the temperature of the memory region 114 does not exceed a temperature threshold for a specified retention time. The memory controller 106 may minimize the temperature profile of the memory regions of interest by controlling the activity in the specified memory region 114 as well as neighboring memory regions 114.

The following paragraphs describe various embodiments of the retention sensor 122 in accordance with the present invention. In one embodiment, each memory region 114 has a retention sensor 122. The memory controller 106 may collect information from the aforementioned retention sensor 122. The collected information may be cross-checked with retention targets as well as with each other. In one embodiment, the memory controller 106 collects historical data from the retention sensor 122 to observe the degradation over time. The memory management schemes can then be used to minimize the usage of affected memory regions 114.

In one embodiment, the retention sensor 122 includes several different sensors. In another embodiment, the retention sensor 122 functions in conjunction with other external sensors. The retention sensor 122 may include a temperature sensor 124 configured to sense a peak temperature for the memory region 114. The temperature sensor 124 may also sense an average temperature for the memory region 114. Stress on the memory region 114 may affect the reliability and storage duration of the memory region 114. In one embodiment, the stress on the memory region 114 is related to the temperature of the memory region 114. For example, a highly stressed memory region 114 may have a larger average or peak temperature. A low stressed memory region 114 may have a cooler average or peak temperature. In one embodiment, the temperature sensor 124 includes a history component to track the cumulative effect of high-temperature exposure. The average temperature of the memory region 114 may be passed to the memory controller to estimate the average retention profile.

In one embodiment, the retention sensor 122 includes an electrical current profiler 126 configured to determine information about one or more electrical currents. The electrical currents stored by the electrical current profiler 126 may be currents applied during one or more previous memory write operation on a part or all of the memory region. For example, the electrical current profiler 126 may store information about the last electrical current applied to a part or all of the memory region 114. In another embodiment, the electric current profiler 126 may store information about a larger number of previous electrical currents applied to a part or all of the memory region 114.

The electrical current profiler 126 may include a current accumulator. In one embodiment, the current accumulator works with a voltage converter/regulator infrastructure on the memory chip to determine the amount of current drawn and maximum current drawn for the memory region 114. It is noted that the size of the memory region 114 may be different for different technology specifications. For design/technologies that are retention/failure challenged the memory region 114 may be smaller. For less challenging options the memory region 114 can be larger.

In one embodiment, the retention sensor 122 includes a counter 128 configured to estimate or count the number of times a memory write operation is performed on a part or all of the memory region. For example, a memory write operation may include a set or reset operation on a bit 130 or group of bits 132 in a memory region 114.

In one embodiment, the counter 128 estimates the number of 1's and 0's stored in part or all of the memory region by using information stored by the electric current profiler 126. For example, the amount of current used in a previous memory write operation may indicate the number of bits 130 in the memory region 114 that are 1's or 0's. This may be accomplished by comparing the amount of current used in a previous memory write to the amount of current used to write an individual 1 or 0 in a memory bit 130 in the memory region 114.

In one embodiment, the retention sensor 122 includes an access pattern profiler 134 configured to determine an elapsed time period between successive memory write operations on a part or all of the memory region 114. The memory controller 106 may use the access pattern profiler 134 together with the counter 128 to develop an access pattern history for the memory region 114.

In one embodiment, the retention sensor 122 includes a memory reference profiler 136. The memory reference profiler 136 may be configured to compare a part or the entire memory region 114 to a reference memory array 138. The reference memory array 138 may be representative of a specified set of memory retention characteristics. A variation of structures can be incorporated in the reference memory array 138 including: (i) average (non-altered) storage which is not exposed to stress, and (ii) altered storage that shows exacerbated profile when exposed to the same conditions.

Figure 2:
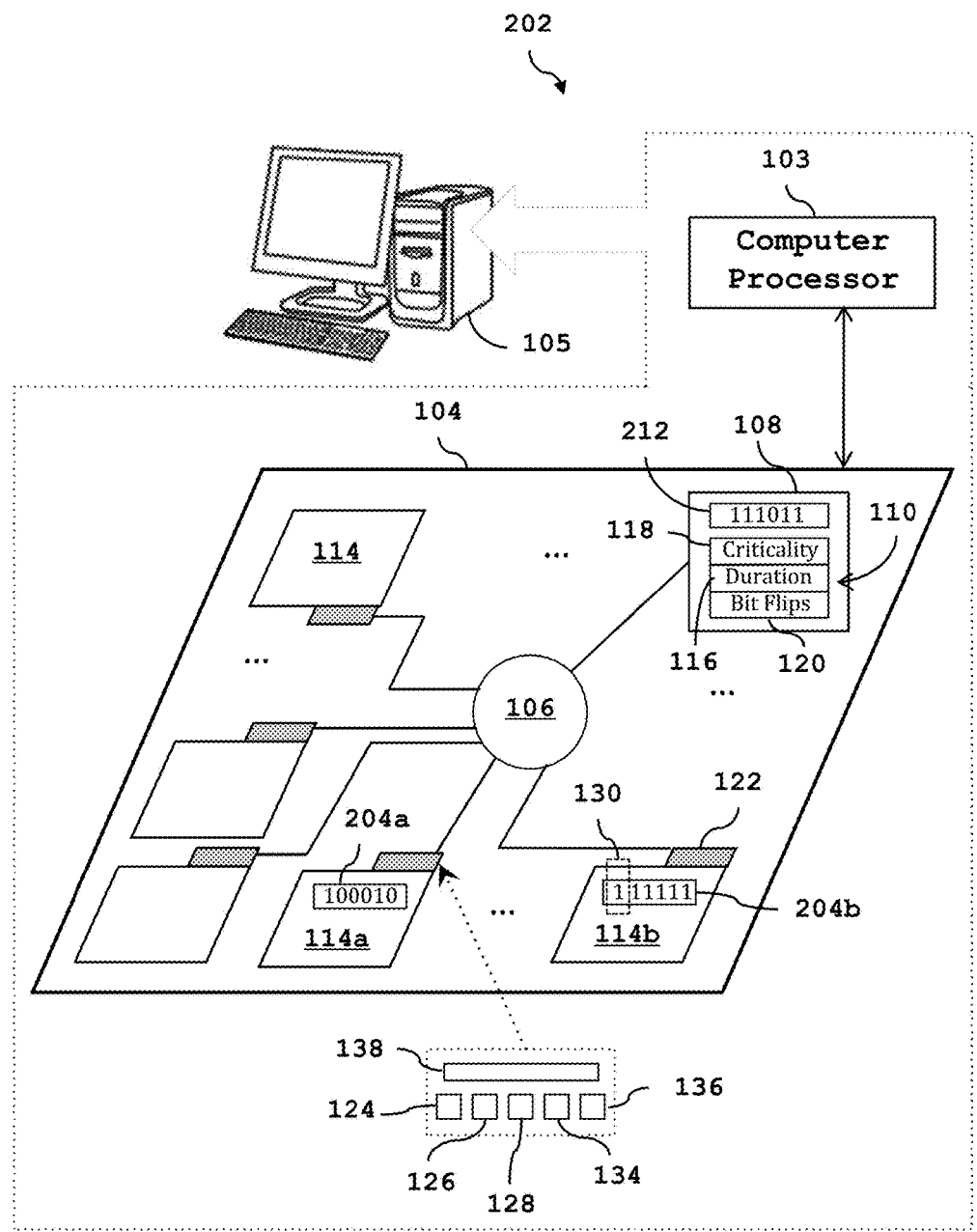
FIG. 2 is a schematic view of an example embodiment of a system for managing stress to memory regions in accordance with the present invention.

FIG. 2 is a schematic view of an example embodiment of a system 202 for managing stress to memory regions 114. In some embodiments, the system 202 includes features described above for system 102. Similar to system 102, the system 202 may include a memory controller 106 configured to receive new data 212 from a software application 108. The new data 212 may be stored in a target memory region 114a. In one embodiment, the memory controller 106 is configured to calculate an estimated number of bits that will be altered in the target memory region 114a to write the new data 212 to the target memory region 114a. ECC or Parity bits on chip may used to create estimated number of bits that will be altered.

In one embodiment, a current profile of the new data to be stored is compared to a previous current profile for the data stored in the phase change region. The current profile may be calculated and stored with the memory controller 106 or separately. In one embodiment, inverted data and shifted data are compared to the former data 204 stored in the target memory region 114a for bit flip estimates. A best case option may be determined, and the estimated number of bits that will be altered may be based on the best case option.

The memory controller 106 may also be configured to compare a bit flip budget with the estimated number of bits that will be altered. The bit flip budget may be calculated and based on memory retention characteristics both present and historical of the memory region 114a.

The system 202 may include an electrical current profiler 126. The electrical current profiler 126 may be configured to store information about an electrical current applied to a part or all of the target memory region 114a. The electrical current stored may have been from one or more previous memory write operation on a part or all of the target memory region 114a. In one embodiment, the memory controller 106 is configured to calculate the estimated number of bits that will be altered based on information stored by the electrical current profiler.

In one embodiment, system 202 is configured to modulate by a computer processor the new data to resemble former data stored on the target memory region. The computer processor may be a processor on the memory chip 104, such as a processor incorporated into the memory controller 106, or an external processor 103. Modulation may include inverting data bits 130 from the application data 112 from 0 to 1 and vice versa. Modulation may also include shifting data bits 130 in the new data 212 as well as other recoverable transformations to the new data 212.

Modulating the new data 212 may minimize the number of bits to be altered in writing the modulated data to the target memory region 114a. In one embodiment, if the estimated number of bits that will be altered in the target memory region 114a exceeds the bit flip budget, the memory controller 106 is further configured to write the new data 212 to an alternate memory region 114b instead of the target memory region 114a. In one embodiment, writing to the alternate memory region 114b is performed instead of modulating the new data. In another embodiment, writing to the alternate memory region 114b is performed in addition to modulating the new data 212. The alternate memory region 114b may resemble the new data 212.

For example, FIG. 2 shows the new data as having an example bit sequence of 111011 and the former data 204a of the target memory region 114a has having an example bit sequence of 100010. In order to write data to the target memory region 114a, the memory controller 106 must convert the 100010 sequence to 111011. This conversion may involve three write operations to convert three of the 1's to 0's. Modulation may perform some of the conversion, or instead the memory controller 106 may select the alternate memory region 114b, which has a more similar sequence of 111111. Writing the new data 212 over the former data 204b of the alternate memory region 114b may only require changing one bit from a 1 to a 0.

In one embodiment, if the estimated number of bits that will be altered in the target memory region exceeds the bit flip budget, the memory controller 106 may be further configured to write the new data 212 to the target memory region 114a after modulation. After the write operation is completed, the resulting data may be marked as shifted or inverted for future reference to reverse the modulation. Other indicators may be used for other types of modulation. Additionally, if the estimated number of bits that will be altered in the target memory region does not exceed the bit flip budget, the memory controller 106 may be configured to skip modulation or selection of an alternate memory region 114b. In this case, the memory controller 106 may be configured to write the new data 212 to the target memory region 114a.

Figure 3:
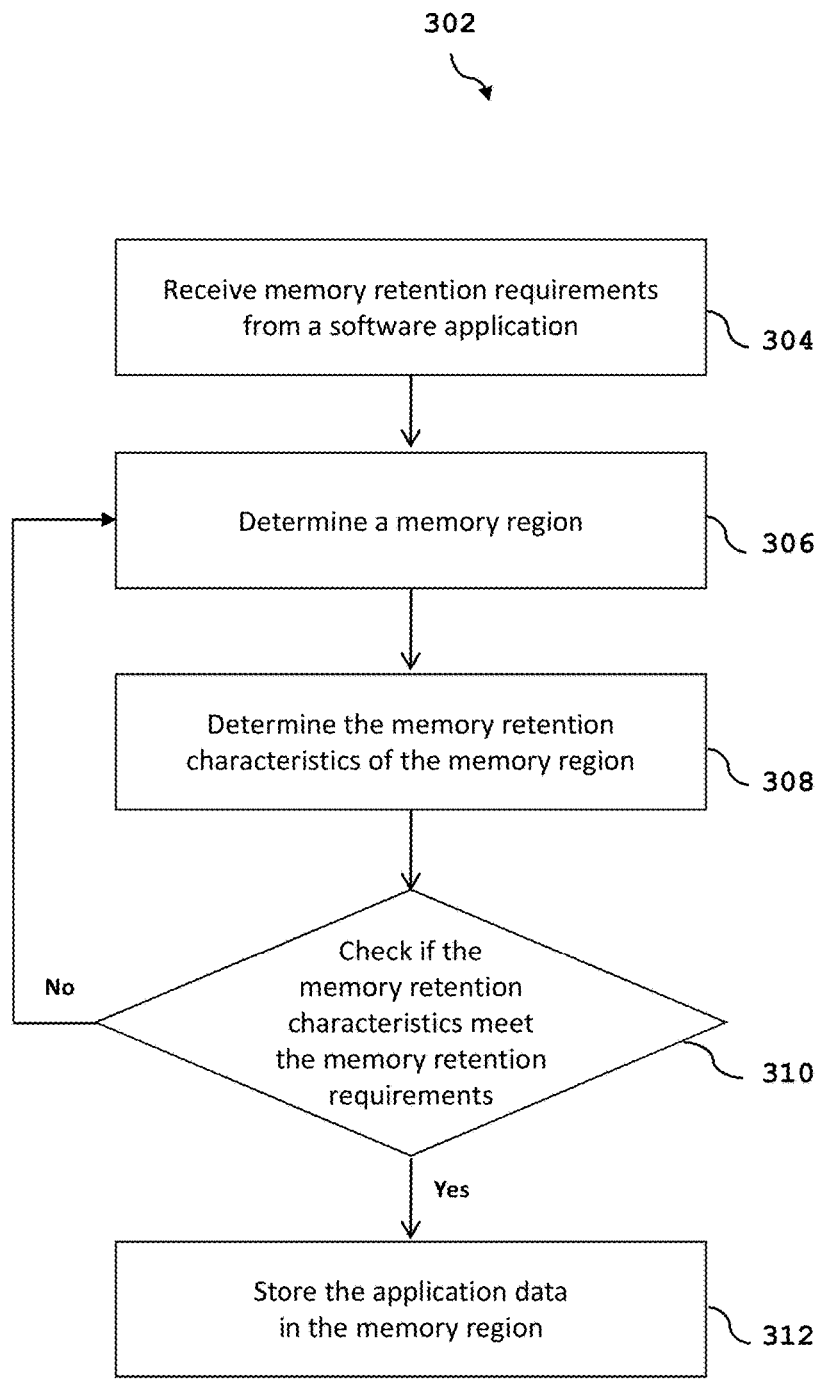
FIG. 3 is a flowchart of an example embodiment of a method of managing memory in accordance with the present invention.
Figure 4:
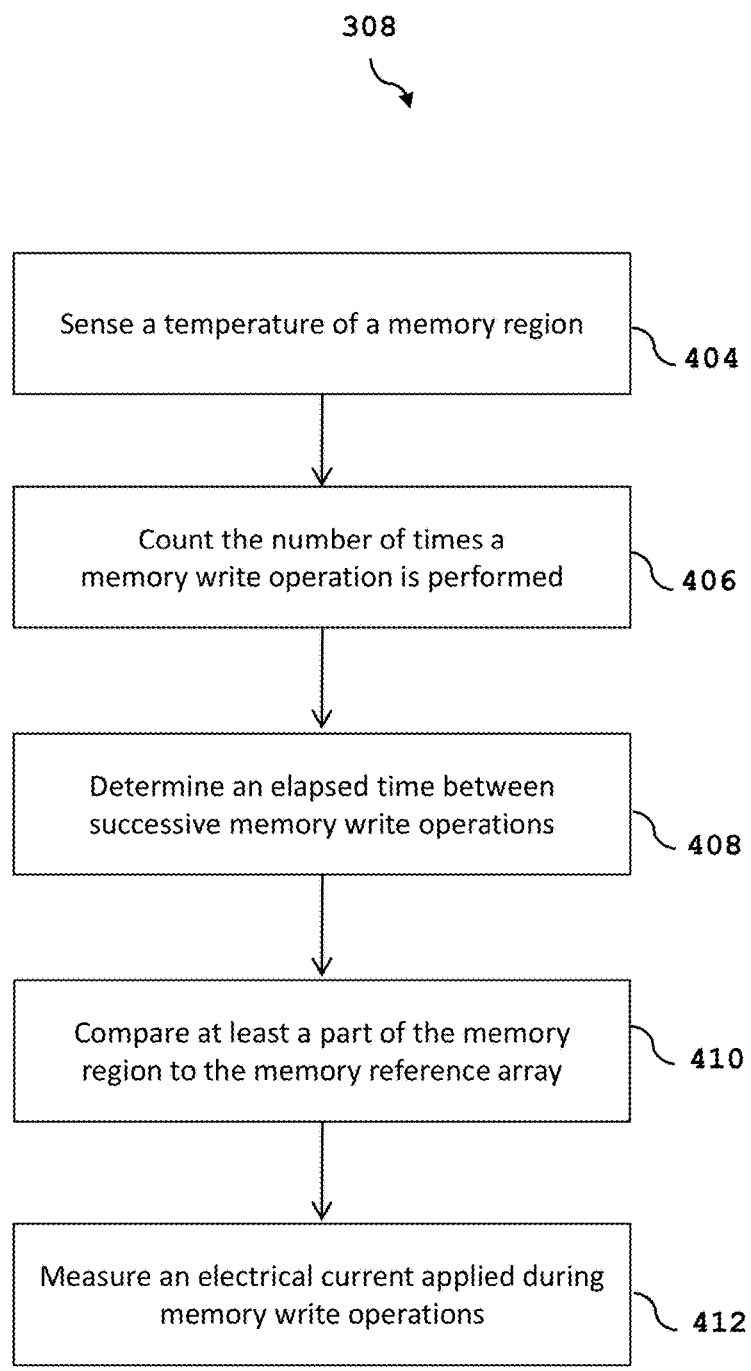
FIG. 4 is a flowchart of an example embodiment of the characteristic determining step of FIG. 3.
Figure 5:
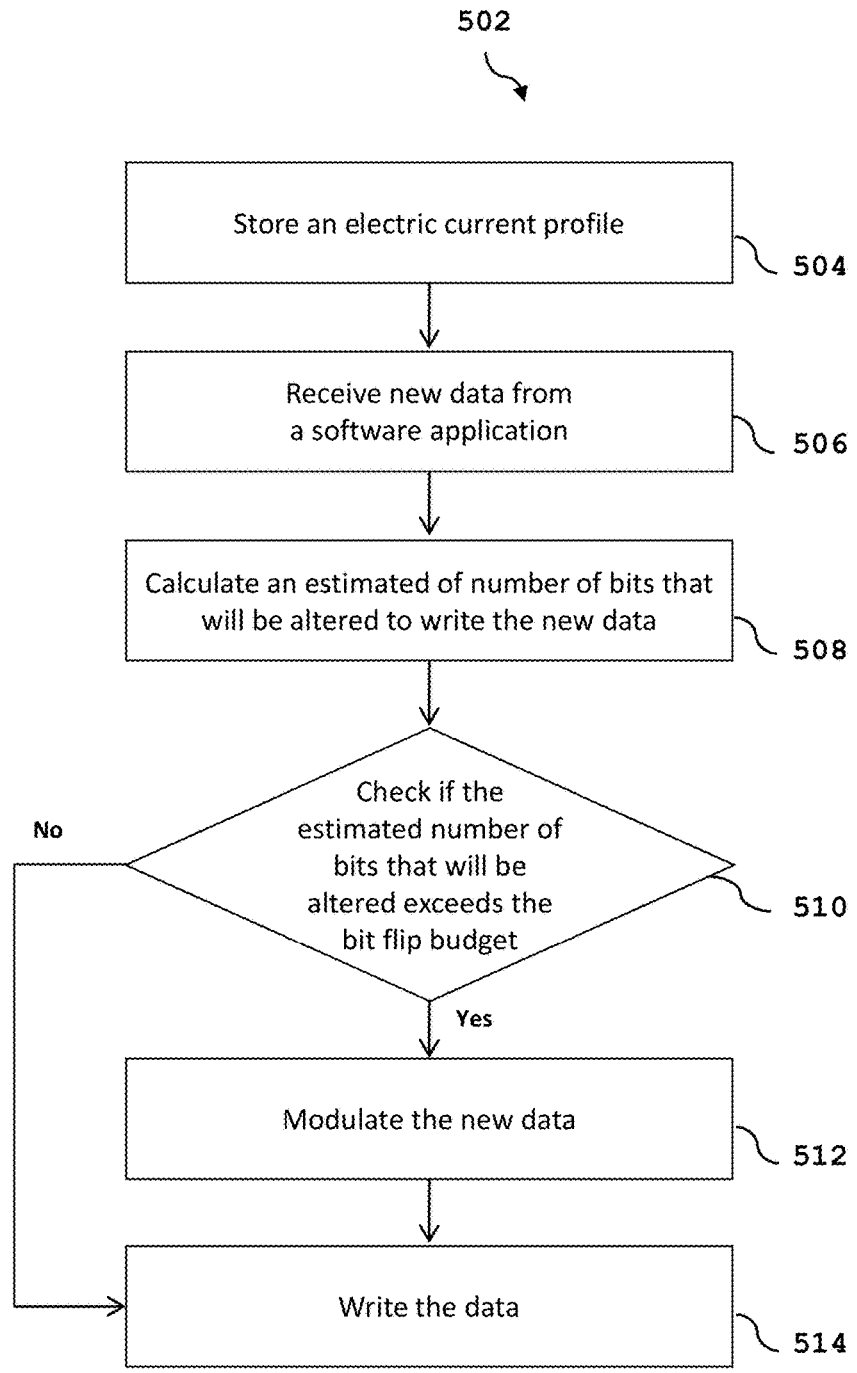
FIG. 5 is a flowchart showing an example embodiment of a method of managing stress to memory regions.

FIGS. 3-5 show example embodiments of methods that may be performed by the systems and memory controllers previously described. The memory controllers may include a computer processor or utilize an external computer processor to perform the steps described below.

FIG. 3 is a flowchart of an example embodiment of a method of managing memory. The method 302 may include a receiving step 304 of receiving from a software application memory retention requirements for application data. In one embodiment, the memory retention requirements include a storage duration length and/or a criticality of data retention. The memory retention requirements are further described above.

The method 302 may include a memory region determining step 306 of determining a potential memory region to store the application data. In one embodiment, the memory region may be chosen at random. In another embodiment, the memory region may be chosen from a list of memory regions that might have memory retention characteristics appropriate for the memory retention requirements.

In one embodiment, the memory region determining step 306 includes determining a memory region of the plurality of memory regions to store the application data such that memory retention loss of the plurality of memory regions is minimized. In one embodiment, the memory region determining step 306 includes determining a memory region of the plurality of memory regions to store the application data such that a temperature of the memory region does not exceed a temperature threshold for a specified retention time.

The method 302 may include a characteristic determining step 308 of determining the memory retention characteristics of a memory region from the plurality of memory regions. The memory retention characteristics may be determined with a retention sensor. The characteristic determining step 308 may include one or more steps described below. In one embodiment, the method 302 includes a comparing step 310 of comparing the memory retention requirements for the application data to the memory retention characteristics of one or more memory regions from the plurality of memory regions. The comparing step 310 may include checking to see if the memory retention characteristics of the memory exceed the memory retention requirements. If yes, the method 302 may proceed to the data storing step 312, but if no, the method 302 may return to the memory region determining step 306 to repeat the process over again until a suitable memory region is found. The method may also include a data storing step 312 of storing the application data in one of a plurality of memory regions based on the memory retention requirements and memory retention characteristics of the memory regions. The memory regions may be in non-volatile memory, and each memory region may have different memory retention characteristics.

FIG. 4 is a flowchart of an example embodiment of the characteristic determining step 308 described above. Each of the steps described below as part of FIG. 4 may be included in determining the memory retention characteristics of the memory region from the plurality of memory regions with the retention sensor. In one embodiment, the characteristic determining step 308 includes a temperature sensing step 404 of sensing an average temperature of the memory region. The temperature sensing step 404 may also include sensing a peak temperature. The temperature sensing step 404 may be performed by the temperature sensor described above.

In one embodiment, the characteristic determining step 308 includes a write operation counting step 406 of counting or estimating a number of times a memory write operation is performed on a part or all of the memory region. The write operation counting step 406 may be performed by the counter described above. The characteristic determining step 308 may also include a time period determining step 408 of determining an elapsed time period between successive memory write operations performed on at least a part of the memory region. The time period determining step 408 may be performed by the access pattern profiler described above.

In one embodiment, the characteristic determining step 308 includes a reference comparing step 410 of comparing a part or all of the memory region to a reference memory array. The reference memory array may be representative of a specified set of memory retention characteristics. The reference comparing step 410 may be performed by the memory reference profiler described above. In one embodiment, the characteristic determining step 308 includes an electrical current measuring step 412 of measuring electrical current applied to a part or all of the memory region. The measured electrical current may be applied during memory write operations on a part or all of the memory region. The electrical current measuring step 412 may be performed by the electric current profiler described above. The steps described in FIGS. 3-4 are described in further detail in connection with the systems described that may perform these steps.

Figure 9:
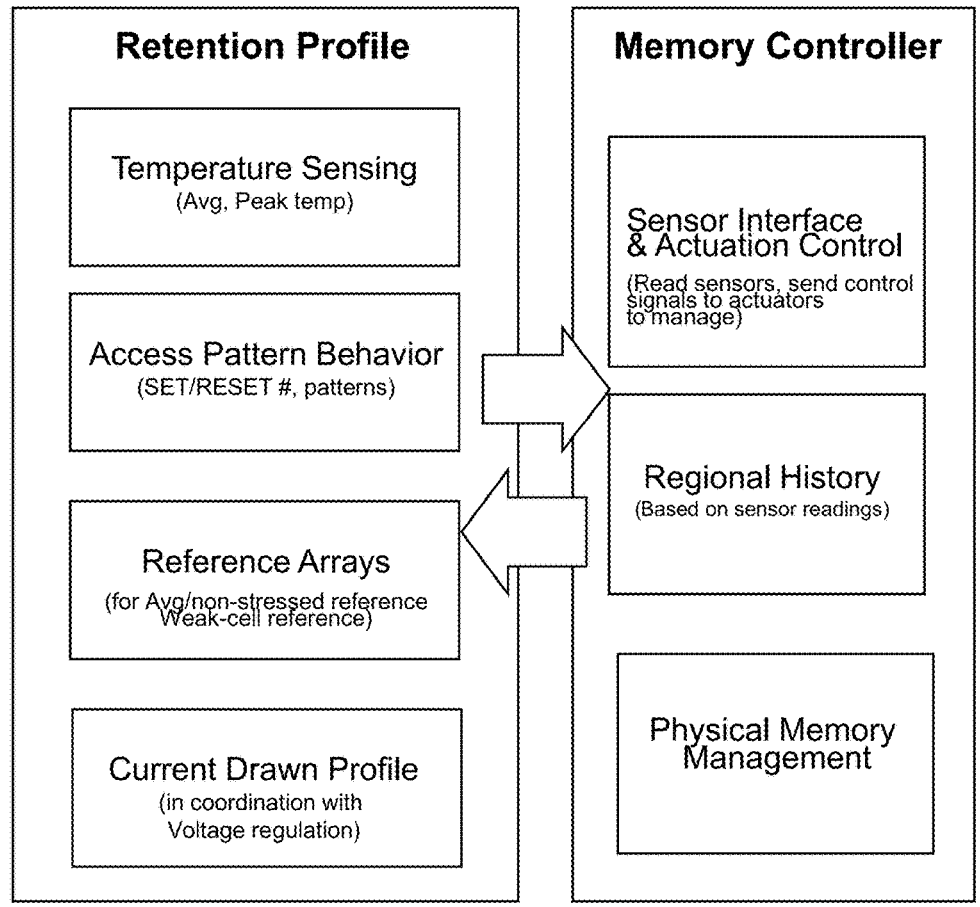
FIG. 9 shows an example embodiment of a system including a retention profile and a memory controller.

FIG. 9 shows an example embodiment of a system including a retention profile and a memory controller. The retention profile may include temperature sensing information, such as average and/or peak temperature. In one embodiment the retention profile includes access pattern behavior information, such as the number of set and/or reset actions and bit patterns. The retention profile may also include one or more reference arrays including an average stressed memory cell and/or a non-stressed reference memory cell. In one embodiment, the retention profile includes a current. The current drawn profile may work in coordination with voltage regulation.

The memory controller may include a sensor interface and actuation control. The sensor interface and actuation control may be configured to read sensors and send control signals to actuators to manage. In one embodiment, the memory controller includes a regional history that may be based on sensor readings on a memory region. The memory controller may also include a physical memory management unit.

Figure 10:
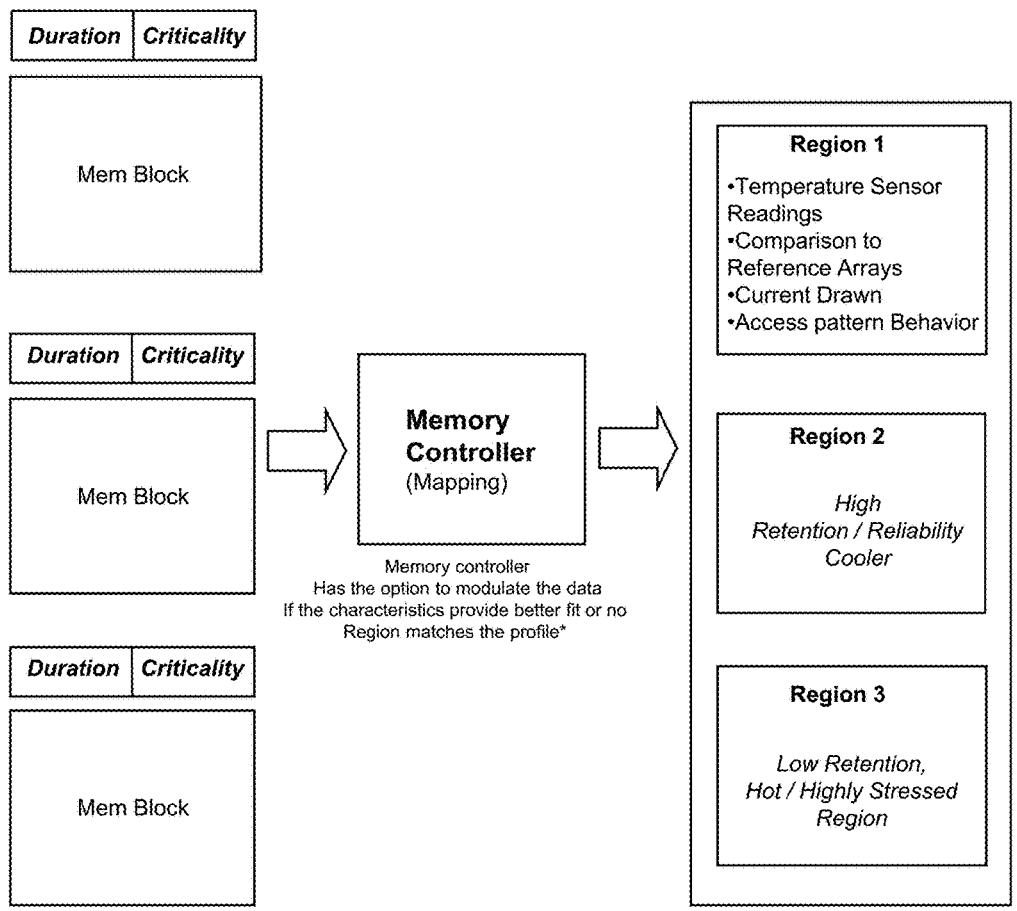
FIG. 10 shows an example embodiment of a system for managing memory with memory regions with different retention characteristics.

FIG. 10 shows an example embodiment of a system for managing memory with memory regions with different retention characteristics. The system may include an unstressed memory region with high retention and/or high reliability. In one embodiment, the unstressed memory is relatively cool in temperature compared to a stressed memory region. The system may include a stressed memory region with low retention. The stressed memory region may have a relatively hot temperature compared to the unstressed memory region. In one embodiment, the system includes incoming memory blocks with associated memory retention characteristics such as storage duration, criticality of storage, and the number of expected bit flips. The memory retention requirements are described in greater detail above.

The memory controller may be configured to map the incoming memory blocks to an appropriate memory region based on a comparison of the memory retention characteristics of the memory region to the memory retention requirements associated with the incoming memory blocks. For example, the memory controller may be configured not to map a memory block to a memory region if the memory region is too reliable or if the memory region is of a lower quality than specified by the memory retention requirements. The memory controller may obtain memory retention characteristics using the retention profile described above.

Figure 11:
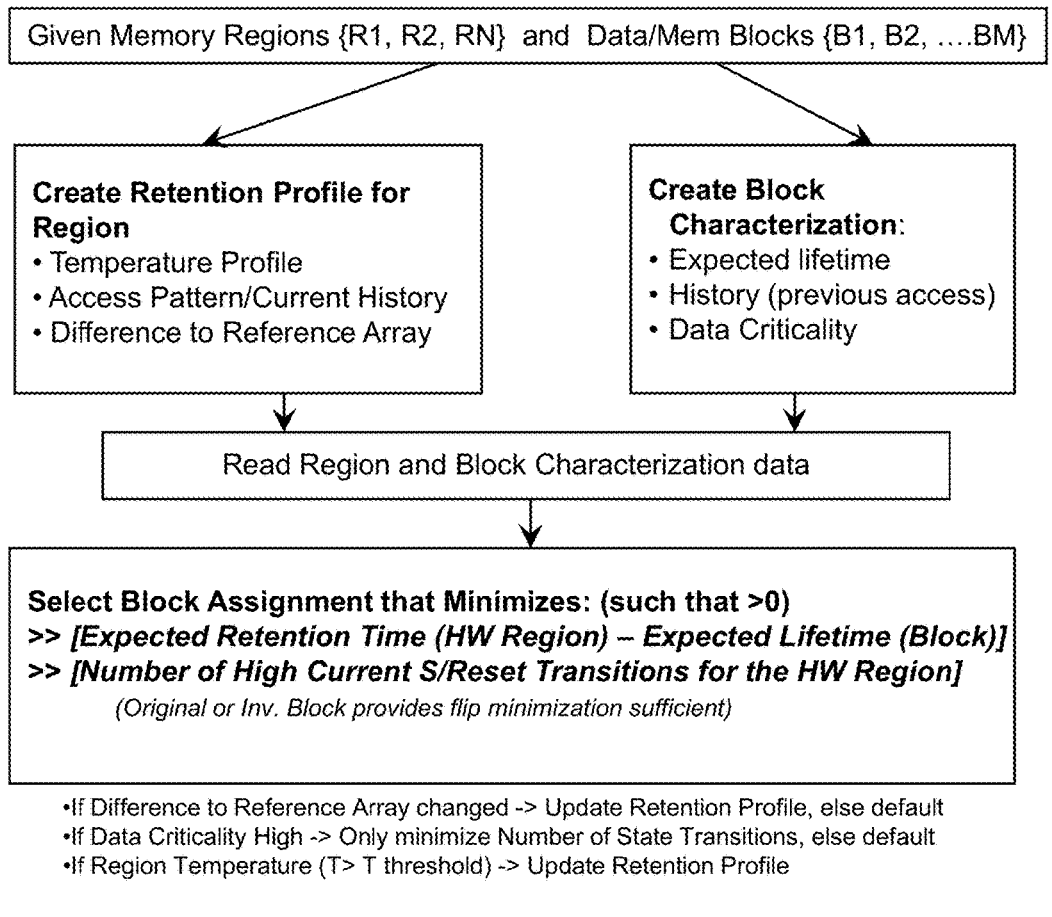
FIG. 11 shows an example embodiment of a method and algorithm for matching incoming memory blocks to memory regions in physical memory.

FIG. 11 shows an example embodiment of a method and algorithm for matching incoming memory blocks to memory regions in physical memory. The method may involve creating a retention profile for a memory region. The retention profile is described above and may include a temperature profile with average and/or peak temperature of the memory region, an access pattern and/or electrical current history with information related to previous electrical currents used to write data to the memory region, and information about the difference between the memory region and reference array. The method may also involve creating a memory block characterization. The memory block characterization may include the memory retention requirements described above. Examples of memory retention requirements include expected lifetime or storage duration, historical information about previous access, and data criticality.

The method may include reading the retention profile for the region and memory block characterization data. In one embodiment, the method includes selecting a block assignment (memory region) in order to minimize the result of subtracting the expected lifetime of the block (specified by memory retention requirement) from the expected retention time (of the assigned memory region). In one embodiment, the method includes selecting a block assignment (memory region) in order to minimize the number of high current set/reset (memory write operations) transitions for the assigned memory region. These minimizations may be performed such that the result of the minimization is greater than zero.

In one embodiment, the minimizing operation may include determining if the difference to reference array changed. If the difference to a reference array is changed, an updated retention profile may be used; otherwise a default retention profile may be used. In one embodiment, if the data criticality is high, the minimizing operation includes only minimizing the number of state transitions; otherwise a default is used. If the memory region temperature is greater than a threshold temperature, the minimizing operation may include updating the retention profile.

FIG. 5 is a flowchart showing an example embodiment of a method 502 of managing stress to memory regions. In some embodiments, the method is similar to method 302 and may include steps from method 302 described above. In one embodiment, the method 502 includes a profile storing step 504 of storing an electrical current profile about an electrical current applied to a part of or the entire target memory region. The electrical current may have been applied to the target memory region in one or more previous memory write operations performed on a part or all of the target memory region. The electrical current profile may be maintained by an electric current profiler. The electric current profiler and target memory region are further described above. The method 502 may include a data receiving step 506 of receiving new data from a software application. The new data may be stored in a target memory region. In addition to sending new data, the software application may send memory retention requirement information. The method 502 may include processing the memory retention requirements as described above in method 402.

In one embodiment, the method 502 includes a calculating step 508 of calculating an estimated number of bits that will be altered in the target memory region to write the new data to the target memory region. Calculating the estimated number of bits that will be altered may be based on the electrical current profile. The method 502 may also include a comparing step 510 of comparing a bit flip budget with the estimated number of bits that will be altered. The comparing step 510 may check to see if the estimated number of bits that will be altered exceeds the bit flip budget. If yes, the method 502 may proceed to the modulating step 512, but if no, the method 502 may skip the modulating step 512 and proceed to the writing step. The calculating step 508 and comparing step 510 may be performed by the memory controller of system 202 as further described above.

In one embodiment, the method 502 includes a modulating step 512 of modulating the new data to resemble former data. The former data may be stored in the target memory region. In one embodiment, modulating the new data involves minimizing bits in the target memory region to be altered. Minimization may occur in writing the modulated data to the target memory region. Modulation is described in further detail above.

The method may include a data writing step 514. In one embodiment, the new data in modulated form is written to the target memory region. This may occur after the modulating step 512 when the estimated number of bits that will be altered in the target memory region exceeds the bit flip budget. In one embodiment, if the estimated number of bits that will be altered in the target memory region exceeds the bit flip budget, the data writing step 514 includes writing the new data to an alternate memory region instead of the target memory region. Though not shown in FIG. 5, in this case, the modulating step 512 is skipped, and the method 502 proceeds to the data writing step. The alternate memory region may resemble the new data.

Figure 6:
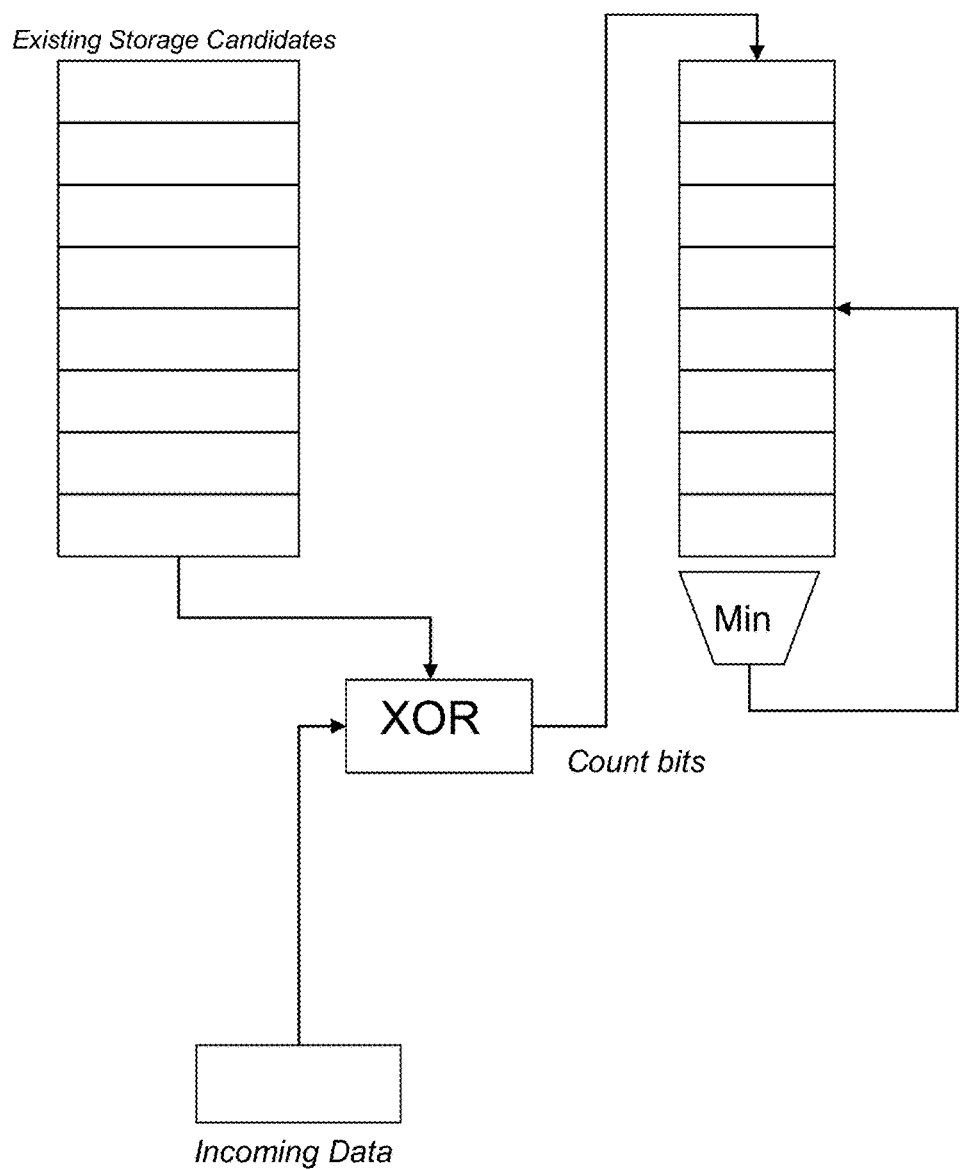
FIG. 6 shows an example embodiment of a system for performing an initial memory matching process.

FIGS. 6-11 show systems and methods in accordance with the present invention that may be incorporated into or include elements from one or more of the systems and methods described above. FIG. 6 shows an example embodiment of a system for performing an initial memory matching process. The system may include a logic unit configured to receive incoming data and one or more storage candidates. The system may compare the incoming data to each of the one or more storage candidates. In one embodiment, the logic unit is an XOR gate configured to count the number of non-matching bits between the incoming data and the storage candidates. It is noted that first-level matching may be done by adding the incoming data bits.

Figure 7:
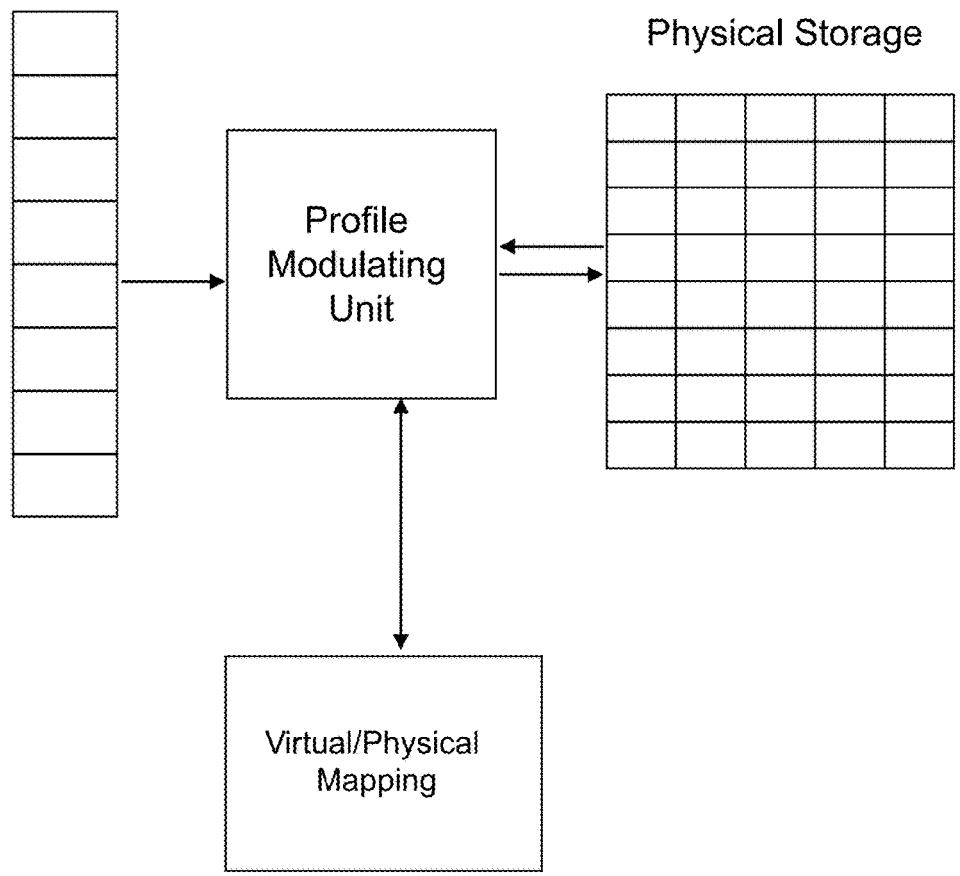
FIG. 7 shows an example embodiment of a system including a profile modulating unit.

FIG. 7 shows an example embodiment of a system including a profile modulating unit. In one embodiment, the profile modulating unit is part of the memory controller described above. The system may include physical storage having memory regions. The system may also include a mapping unit. In one embodiment, the profile modulating unit is configured to receive data profiles. Data profiles may include, for example, the pattern and percentage of 1s or 0s. The profile modulating unit may be configured to perform some or all of the following: check incoming data profiles, determine physical storage regions with matching characteristics, create a target list, evaluate based on maximum profile match, and finalize mapping (in coordination with a mapping table not shown).

Figure 8:
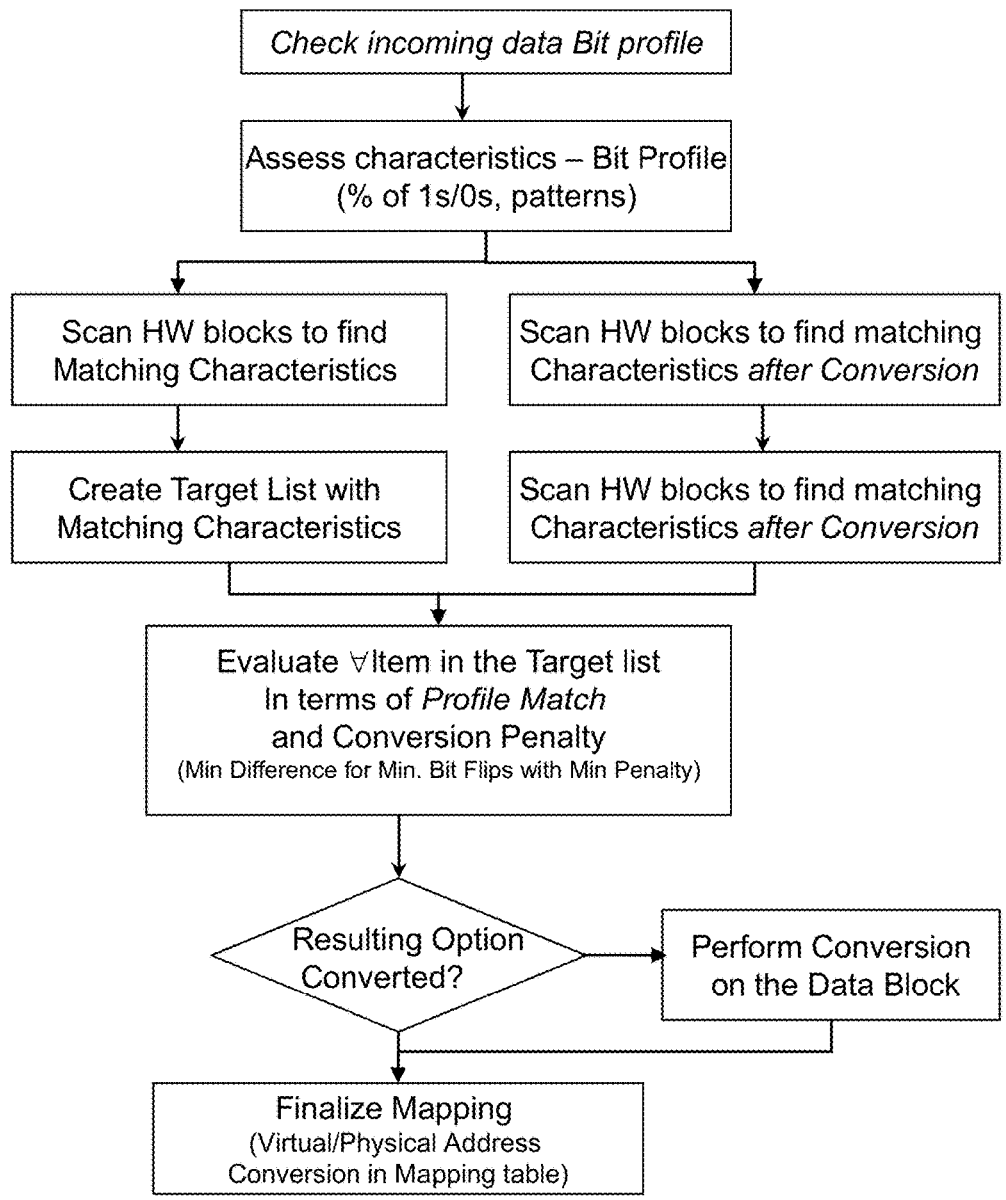
FIG. 8 shows an example embodiment of a method and algorithm for evaluating bit profiles in accordance with the present invention.

FIG. 8 shows an example embodiment of a method and algorithm for evaluating bit profiles in accordance with the present invention. The method may include checking a data bit profile and assessing the characteristics of the data bit file. Example characteristics may include the pattern and percentage of 1s or 0s. Next, the method may include scanning the HW blocks (memory regions) to find matching characteristics. HW blocks with characteristics matching the data bit profiles may be placed in a target list. The method may include evaluating each item of the target list in terms of profile match and conversion penalty. In one embodiment, the method identifies a minimum difference for a minimum number of bit flips with minimum conversion penalty. If the HW block has not already been converted to store the incoming data, the HW block is converted to store the incoming data. Then, mapping may be finalized.

While the preferred embodiments to the invention have been described, it will be understood that those skilled in the art, both now and in the future, may make various improvements and enhancements that fall within the scope of the claims which follow. These claims should be construed to maintain the proper protection for the invention first described.

What is claimed is:

1. A method of managing memory, comprising:
   receiving, from a software application, memory retention requirements for application data, the memory retention requirements including at least one of a storage duration length, data criticality, application priority and a criticality of data retention;
   receiving the application data;
   determining a data characteristic of the application data, the data characteristic including a pattern and percentage of 1s and 0s of the application data;
   scanning a plurality of non-volatile memory regions in a memory chip to locate a target memory region in the memory chip matching the memory retention requirements for the application data and the data characteristic of the application data to store the application data with a minimum number of bit flips; and
   storing the application data in the target memory region; and
   wherein the non-volatile memory regions from the plurality of non-volatile memory regions have different memory retention characteristics from one another.

2. The method of claim 1, further comprising:
   determining the memory retention characteristics of a memory region from the plurality of memory regions with a retention sensor; and
   comparing the memory retention requirements for the application data to the memory retention characteristics of at least one memory region from the plurality of memory regions.

3. The method of claim 2, wherein determining the memory retention characteristics of the memory region from the plurality of memory regions with the retention sensor includes sensing an average temperature of the memory region.

4. The method of claim 2, wherein determining the memory retention characteristics of the memory region includes utilizing one or more reference arrays, the reference arrays including an average stressed memory cell and a non-stressed memory cell.

5. The method of claim 2, wherein determining the memory retention characteristics of the memory region from the plurality of memory regions with the retention sensor includes counting a number of times a memory write operation is performed on at least a part of the memory region.

6. The method of claim 2, wherein determining the memory retention characteristics of the memory region from the plurality of memory regions with the retention sensor includes:
   determining an elapsed time period between successive memory write operations performed on at least a part of the memory region; and
   determining memory access patterns of the memory region.

7. The method of claim 2, wherein determining the memory retention characteristics of the memory region from the plurality of memory regions with the retention sensor includes:
   comparing at least a part of the memory region to a reference memory array, the reference memory array being representative of a specified set of memory retention characteristics.

8. The method of claim 2, wherein determining the memory retention characteristics of the memory region from the plurality of memory regions with the retention sensor includes:
   measuring electrical current applied to at least a part of the memory region during memory write operations on the at least a part of the memory region.

9. The method of claim 1, further comprising:
   determining a memory region of the plurality of memory regions to store the application data such that memory retention loss of the plurality of memory regions is minimized.

10. The method of claim 1, further comprising:
    determining a memory region of the plurality of memory regions to store the application data such that a temperature of the memory region does not exceed a temperature threshold for a specified retention time.

11. A system for managing memory, comprising:
    a computer memory chip including non-volatile memory; and
    a memory controller configured to:
      receive, from a software application, memory retention requirements for application data;
      receive the application data;
      determine a data characteristic of the application data, the data characteristic including a pattern and percentage of 1s and 0s of the application data;
      scan a plurality of non-volatile memory regions of a memory chip to locate a target memory region in the memory chip matching the memory retention requirements for the application data and the data characteristic of the application data to store the application data with a minimum number of bit flips; and
      store the application data in the target memory region; and
    wherein the non-volatile memory regions from the plurality of non-volatile memory regions have different memory retention characteristics from one another.

12. The system of claim 11, wherein the memory controller is further configured to:
    determine the memory retention characteristics of the memory region from the plurality of memory regions with a retention sensor; and compare the memory retention requirements for application data to the memory retention characteristics of the memory region from the plurality of memory regions.

13. The system of claim 12, wherein the retention sensor includes:
a temperature sensor configured to sense a peak temperature for the memory region.

14. The system of claim 12, wherein the retention sensor includes:
a counter configured to estimate a number of times a memory write operation is performed on at least a part of the memory region.

15. The system of claim 12, wherein the retention sensor includes:
an access pattern profiler configured to determine an elapsed time period between successive memory write operations on at least a part of the memory region.

16. The system of claim 12, wherein the retention sensor includes:
a memory reference profiler configured to compare at least a part of the memory region to a reference memory array, the reference memory array being representative of a specified set of memory retention characteristics.

17. The system of claim 12, wherein the retention sensor includes:
an electrical current profiler configured to determine information about at least one electrical current applied to at least a part of the memory region during at least one previous memory write operation on the at least a part of the memory region.

18. The system of claim 11, wherein the memory controller is further configured to:
determine the memory region of the plurality of memory regions to store the application data such that memory retention loss to at least one of the plurality of memory regions is minimized.

19. The system of claim 11, wherein the memory controller is further configured to:
determine the memory region of the plurality of memory regions to store the application data such that a temperature of the memory region does not exceed a temperature threshold for a specified retention time.

20. The system of claim 11, wherein the memory controller is further configured to:
receive new data from the software application, the new data to be stored in the target memory region from the plurality of non-volatile memory regions; and
modulate the new data to minimize bits in the target memory region to be altered in writing the modulated data to the target memory region.

21. The method of claim 1, further comprising:
receiving new data from the software application, the new data to be stored in the target memory region from the plurality of non-volatile memory regions; and
modulating the new data to minimize bits in the target memory region to be altered in writing the modulated data to the target memory region.

* * * * *